United States Patent
Lee et al.

(10) Patent No.: US 9,871,401 B2
(45) Date of Patent: Jan. 16, 2018

(54) METHOD AND APPARATUS FOR CONTROLLING LOW-VOLTAGE BATTERY CHARGING

(71) Applicant: HYUNDAI MOTOR COMPANY, Seoul (KR)

(72) Inventors: Kyu Il Lee, Yongin-si (KR); Boung Ho Min, Yongin-si (KR); Sung Gone Yoon, Suwon-si (KR)

(73) Assignee: HYUNDAI MOTOR COMPANY, Seoul (KR)

(*) Notice: Subject to any disclaimer, the term of this patent is extended or adjusted under 35 U.S.C. 154(b) by 399 days.

(21) Appl. No.: 14/637,300

(22) Filed: Mar. 3, 2015

(65) Prior Publication Data
US 2016/0105052 A1   Apr. 14, 2016

(30) Foreign Application Priority Data
Oct. 14, 2014  (KR) .................... 10-2014-0138472

(51) Int. Cl.
*H02J 7/00*   (2006.01)
*H02J 7/14*   (2006.01)
*G01R 31/36*  (2006.01)

(52) U.S. Cl.
CPC .......... *H02J 7/1423* (2013.01); *H02J 7/0054* (2013.01); *G01R 31/362* (2013.01); *Y02T 10/7005* (2013.01)

(58) Field of Classification Search
CPC .... H02J 7/0054; H02J 7/1423; G01R 31/362; Y02T 10/7005
USPC ................................. 320/101, 104, 132, 161
See application file for complete search history.

(56) References Cited

U.S. PATENT DOCUMENTS

| 7,906,864 | B2 | 3/2011 | Ko |
| 2009/0115378 | A1 | 5/2009 | Ko |
| 2014/0214251 | A1* | 7/2014 | Sugiyama ............. B60W 20/00 701/22 |

FOREIGN PATENT DOCUMENTS

| JP | 2004-023939 A | 1/2004 |
| JP | 2010-120515 A | 6/2010 |
| KR | 10-2009-0047181 A | 5/2009 |
| KR | 10-1103877 B1 | 1/2012 |
| KR | 10-2012-0018495 A | 3/2012 |
| KR | 10-2013-0129286 A | 11/2013 |
| KR | 10-1439059 B1 | 11/2014 |

OTHER PUBLICATIONS

Korean Office Action issued in corresponding Korean Patent Application, dated Aug. 6, 2015; 5 pages.
Korean Office Action issued in Application No. 10-2014-0138472 dated Aug. 26, 2016.

* cited by examiner

*Primary Examiner* — Edward Tso
*Assistant Examiner* — Aaron Piggush
(74) *Attorney, Agent, or Firm* — McDermott Will & Emery LLP

(57) ABSTRACT

A method for controlling low-voltage battery charging may include determining a state-of-charge (SOC) of a low-voltage battery based on a voltage of the low-voltage battery. A base charging voltage is set according to the SOC of the low-voltage battery. A charging voltage of the low-voltage battery is set based on the base charging voltage, a vehicle operation mode, and a SOC of a high-voltage battery.

11 Claims, 4 Drawing Sheets

FIG. 4

| state-of-charge of low-voltage battery | full-charge | normal | discharge |
|---|---|---|---|
| base charging voltage | 1st charging voltage | 2nd charging voltage | 3rd charging voltage |

FIG. 5

| operation mode | drive mode | | | fuel cell stop mode | urgent mode |
|---|---|---|---|---|---|
| | 1st drive mode | 2nd drive mode | | | |
| | | regeneration mode | power assist mode | | |
| charging voltage | | 8th charging voltage | 9th charging voltage | base charging voltage | 10th charging voltage |

| state-of-charge of high-voltage battery | Critical High (higher than 65%) | Normal SOC (55 ~ 65%) | Low SOC (55 ~ 50%) | Critical Low (lower than 50%) |
|---|---|---|---|---|
| charging voltage | 4th charging voltage | 5th charging voltage | 6th charging voltage | charging voltage |

METHOD AND APPARATUS FOR CONTROLLING LOW-VOLTAGE BATTERY CHARGING

CROSS REFERENCE TO RELATED APPLICATION

The present application claims the benefit of priority to Korean Patent Application Number 10-2014-0138472 filed on Oct. 14, 2014, the entire contents of which application are incorporated herein for all purposes by this reference.

TECHNICAL FIELD

The present disclosure relates to method and apparatus for controlling low-voltage battery charging, which variably control charging voltage of a low-voltage battery according to a state-of-charge (SOC) of the low-voltage battery, a vehicle operation mode, and a SOC of a high-voltage battery.

BACKGROUND

As well known in the art, to improve fuel efficiency of a vehicle and stability of a system, charging voltage for a low-voltage battery is set based on an operation mode of a fuel cell vehicle and a state-of-charge (SOC) of a high-voltage battery.

However, a 12 V low-voltage battery may be discharged when a driver accidently leaves an interior light on when the vehicle is parked for a long period of time. In this case, voltage control according to a conventional art may accelerate discharge of the battery. The discharged state of the 12 V low-voltage battery may lead to the vehicle not starting.

The foregoing is intended merely to aid in the understanding of the background of the present disclosure, and is not intended to mean that the present disclosure falls within the purview of the related art that is already known to those skilled in the art.

SUMMARY

The present disclosure has been made keeping in mind the above problems. An aspect of the present inventive concept provides a method and apparatus for controlling low-voltage battery charging, which variably control voltage charging of a low-voltage direct current converter according to a vehicle operation mode, and set charging voltage for a low-voltage battery according to a SOC of the low voltage battery.

A method for controlling low-voltage battery charging according to the present disclosure may include determining a SOC of a low-voltage battery based on a voltage of the low-voltage battery. A base charging voltage is set according to the SOC of the low-voltage battery. A charging voltage for the low-voltage battery is set based on the base charging voltage, a vehicle operation mode, and a SOC of a high-voltage battery.

The step of determining the SOC may include a first step for measuring the voltage of the low-voltage battery after a vehicle starts. A second step measures the voltage of the low-voltage battery after the first step. A voltage slope is calculated based on the voltage measured in the first step and the second step. The SOC of the low-voltage battery is determined according to the voltage slope.

The second step may be performed when a driving speed of an electric pump of the vehicle reaches a predetermined speed.

The SOC of the low-voltage battery may be determined to one among a fully-charged state, a normal state, and a discharged state.

The SOC of the low-voltage battery is determined to be in the fully-charged state when the voltage slope is greater than a first slope, determined to be in the normal state when the voltage slope is less than the first slope and greater than a second slope, and determined to be in the discharged state when the voltage slope is less than the second slope.

When the SOC of the low-voltage battery is in the normal state, the base charging voltage is set to be higher than when it is in the fully-charged state. When a SOC of the low-voltage battery is in the discharged state, the base charging voltage is set to be higher than when it is in the normal state.

The operation mode includes drive modes including a first drive mode and second drive mode, a fuel cell stop mode, and an urgent mode. The first drive mode may be classified to multiple stages based on the SOC of the high-voltage battery.

The second drive mode may include a regeneration mode and a power assist mode.

When the operation mode of the vehicle is the first drive mode, the charging voltage for the low-voltage battery is set to a sum of the base charging voltage and an offset charging voltage, and the offset charging voltage is set based on the SOC of the high-voltage battery.

When the operation mode of the vehicle is the fuel cell stop mode, the charging voltage for the low-voltage battery may be set to the base charging voltage.

An apparatus for controlling low-voltage battery charging according to the present disclosure may include a fuel cell stack, which is used as a main power source, for supplying a power to a vehicle driving system. A high-voltage direct current converter receives the power supplied from the fuel cell stack. A high-voltage battery receives the voltage stepped down by the high-voltage direct current converter. A low-voltage direct current converter is connected to a high-voltage bus terminal in between the fuel cell stack and the high-voltage direct current converter and converts the voltage. A low-voltage battery which is charged with the low voltage is converted by the low-voltage direct current converter. A controller determines a SOC of the low-voltage battery based on the voltage of the low-voltage battery, sets a base charging voltage according to the SOC of the low-voltage battery, and sets a charging voltage for the low-voltage battery based on the base charging voltage, the vehicle operation mode, and the SOC of the high-voltage battery.

According to the method and apparatus for controlling the low voltage battery charging configured as described above, it is possible to prevent a low-voltage battery from discharge so as to improve startability of a vehicle by setting charging voltage for the low-voltage battery based on a SOC of the low-voltage battery.

Further, fuel efficiency of a vehicle may be improved through a variable control on voltage charging of a battery according to a state of the battery and operation mode of the vehicle.

BRIEF DESCRIPTION OF THE DRAWINGS

FIG. 4 is a table illustrating an example of a base charging voltage depending on a SOC of a low-voltage battery in a method for controlling low-voltage battery charging according to an embodiment of the present inventive concept.

FIG. 5 is a table illustrating an example of a charging voltage of a low-voltage battery depending on an operation mode in a method for controlling low-voltage battery charging according to an embodiment of the present inventive concept.

DETAILED DESCRIPTION

An apparatus for controlling low-voltage battery charging according to an embodiment of the present inventive concept will be described referring to the accompanying drawings.

Figure 1:
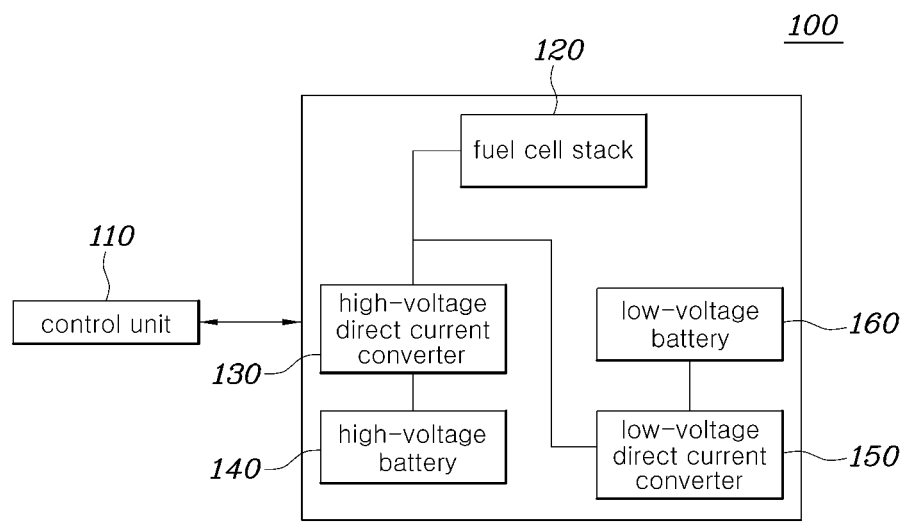
FIG. 1 is a block diagram illustrating an apparatus for controlling low-voltage battery charging according to an embodiment of the present inventive concept.

FIG. 1 is a block diagram illustrating an apparatus for controlling low-voltage battery charging according to an embodiment of the present inventive concept. Referring to FIG. 1, an apparatus 100 may include a fuel cell stack 120, which is used as a main power source, for supplying a power to a vehicle driving system. A high-voltage direct current converter 130 receives the power from the fuel cell stack 120. A high-voltage battery 140 receives the voltage which is stepped down by the high-voltage direct current converter 130. A low-voltage direct current converter 150 is connected to a high-voltage bus terminal in between the fuel cell stack 120 and the high-voltage direct current converter 130 and converts the voltage. A low-voltage battery 160 is charged with the low voltage converted by the low-voltage direct current converter 150. A controller 110 is configured to control voltage charging for the low-voltage battery 160.

A method for controlling low-voltage battery charging according to an exemplary embodiment of the present inventive concept will be described referring to the accompanying drawings.

Figure 2:
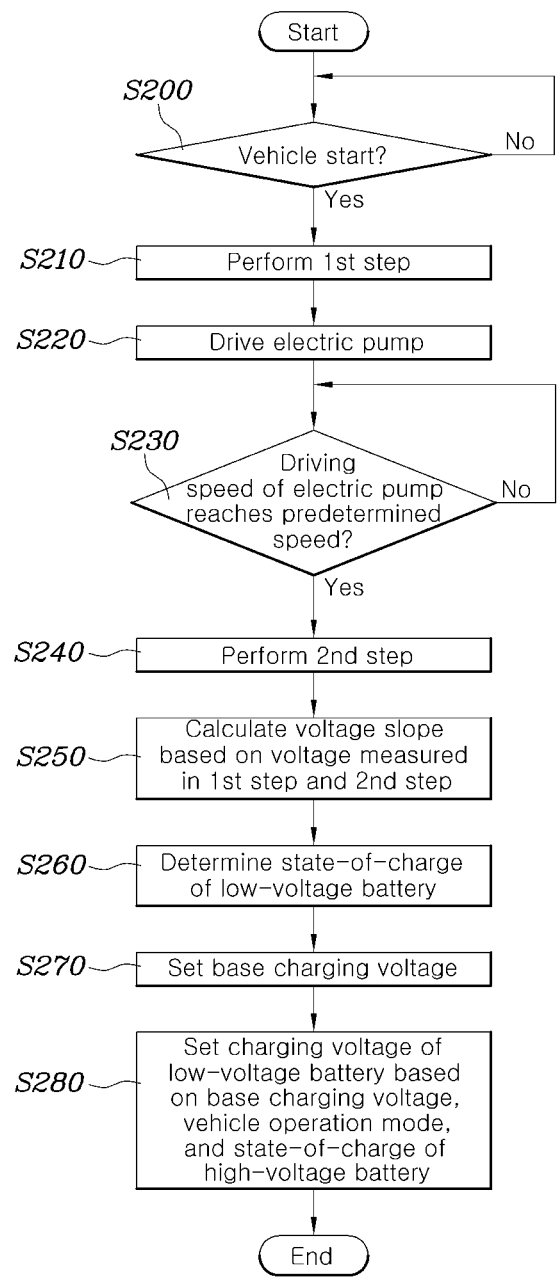
FIG. 2 is a flow diagram illustrating a method for controlling low-voltage battery charging according to an embodiment of the present inventive concept.
Figure 3:
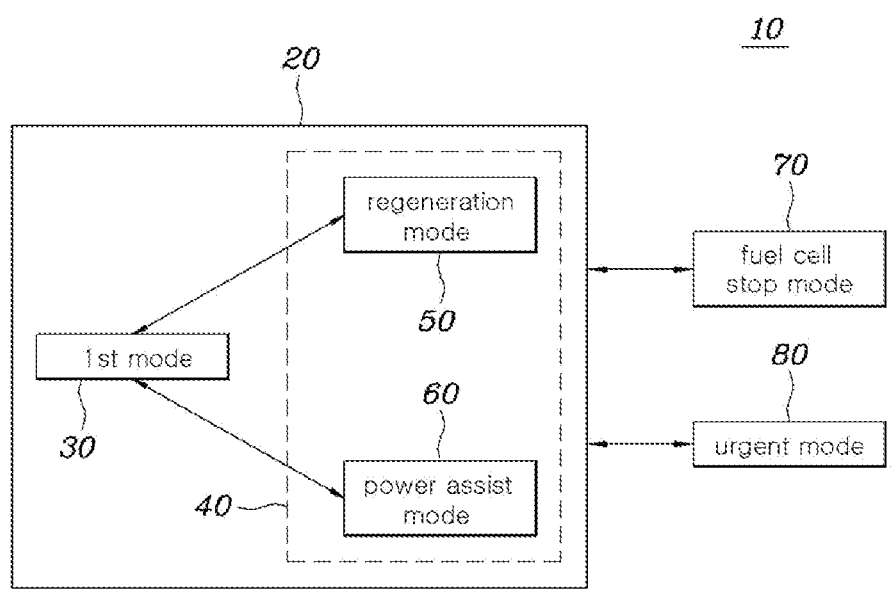
FIG. 3 is a block diagram illustrating relations between operation modes, which are classified for performing a method for controlling low-voltage battery charging.

FIG. 2 is a flow diagram illustrating a method for controlling a low-voltage battery charging according to an embodiment of the present inventive concept, and FIG. 3 is a block diagram illustrating relations between operation modes, which are classified for performing the method for controlling low-voltage battery charging. FIG. 4 is a table illustrating an example of a base charging voltage depending on a SOC of a low-voltage battery in a method for controlling low-voltage battery charging according to an embodiment of the present inventive concept, and FIG. 5 is a table illustrating an example of a charging voltage of a low-voltage battery depending on operation modes in a method for controlling low-voltage battery charging according to an embodiment of the present inventive concept.

Referring to FIGS. 2 to 5, a method for controlling low-voltage battery charging may include determining a SOC of a low-voltage battery based on a voltage of the low-voltage battery (S260). A base charging voltage is set according to the SOC of the low-voltage battery (S270). A charging voltage for the low-voltage battery is set based on the base charging voltage, a vehicle operation mode, and a SOC of a high voltage battery (S280). The step of determining the SOC of the low-voltage battery may include a first step of measuring the voltage of the low-voltage battery after a vehicle starts (S210). A second step measures the voltage of the low-voltage battery after the first step (S240). A voltage slope is calculated based on the voltage respectively measured in the first step and second step (S250). The SOC of the low-voltage battery is determined according to the voltage slope (S260).

More specifically, after determining whether the vehicle has started (S200), the controller 110 measures the voltage of the low-voltage battery at the time of starting the vehicle by the first step (S210). If the vehicle does not start, the controller 110 repeatedly determines whether the vehicle has started (S200). The voltage slope is calculated by dividing the difference from the voltage measured in the second step to the first step by the difference between a running time of the first step and second step.

In this case, the second step is performed when a driving speed of an electric pump of the vehicle reaches a predetermined speed after the first step.

In other words, the controller 110 drives the electric pump of the vehicle using the low-voltage battery when performing the first step as the vehicle starts. After that, the controller 110 determines whether the driving speed of the electric pump reaches the predetermined speed (S230). If the driving speed of the electric pump reaches the predetermined speed, the controller 110 determines that the low-voltage battery has outputted energy according to a constant load and measures the voltage of the low-voltage battery (S240). Since the SOC of the low-voltage battery is determined when the low-voltage battery constantly outputs energy according to the constant load, it is possible to accurately determine the SOC of the low voltage battery. The electric pump may be a water pump to cool electric parts for a vehicle fuel cell system.

As shown in FIG. 4, a SOC of a low-voltage battery is determined to one among a fully-charged state, a normal state, and a discharged state. More concretely, when a first slope indicates a lower limit of a fully-charged state of the low-voltage battery and a second slope, which is smaller than the first slope, indicates an upper limit of a discharged state of the low-voltage battery, if the voltage slope is greater than the first slope, the battery is determined to be in a fully-charged state. If the voltage slope is less than the first slope and greater than the second slope, the battery is determined to be in a normal state. If the voltage slope is less than the second slope, the battery is determined to be in a discharged state.

A base charging voltage is set to a first charging voltage, a second charging voltage, or a third charging voltage when the SOC of the low-voltage battery is in the fully-charged state, a normal state, and a discharged state, respectively. In this case, the first charging voltage may be lower than the second and third charging voltage. The second charging voltage may be higher than the first charging voltage and less than the third charging voltage. The third charging voltage may higher than the first and second charging voltage.

Specifically, when discharge of the low-voltage battery occurs, the heavier discharge from the low-voltage battery causes the higher internal resistance in the low-voltage battery, and thus, the voltage measured in the second step (S240) is relatively lower than the voltage measured in the first step (S210). In other words, the controller 110 determines that the low-voltage battery is in a heavier discharge state as the calculated voltage slope becomes lower. On the contrary, the greater the calculated voltage slope, the less internal voltage in the low-voltage battery, and it is determined the low-voltage battery is near the fully-charged state.

Accordingly, the discharge of the low-voltage battery may be prevented by setting the charging voltage of the low-voltage battery to be high through setting the base charging voltage to be high when the low-voltage battery is being discharged. On the other hand, the low-voltage battery may be prevented from overcharge by setting the charging voltage of the low-voltage battery to be low through setting the base charging voltage to be low when the low-voltage battery is fully-charged.

As shown in FIG. 3, an operation mode 10 of the present disclosure includes drive modes 20 including a first drive mode 30 and a second drive mode 40, a fuel cell stop mode 70, and an urgent mode 80. The first drive mode 30 is classified into multiple stages based on a SOC of the high voltage battery, and the second drive mode 40 may include a regeneration mode 50 and a power assist mode 60. The controller 110 determines which drive mode the vehicle is in, and may control low-voltage battery charging based on the charging voltage predetermined according to the modes.

The first drive mode 30 is classified into the multiple stages based on a SOC of the high-voltage battery. The first drive mode and a general drive mode correspond to the drive modes 20 which indicate that a vehicle is being driven, excluding the second drive mode 40 that includes the regeneration mode 50 and power assist mode 60.

The multiple stages include four stages classified by the SOC of the high-voltage battery, and the four stages may include a normal stage in which the SOC of the high-voltage battery is 55% to 65%. The SOC of the high-voltage battery is higher than 65% in a critical high stage. The SOC of the high-voltage battery is lower than 50%; in a critical low stage, and the SOC of the high-voltage battery is 50% to 55% in a low stage.

The regeneration mode 50 of the second drive mode 40 intends to reclaim regenerative braking energy from a motor. Specifically, the regeneration mode 50 charges the high-voltage battery with electrical energy converted from kinetic energy of the vehicle through electricity generation of a motor when slowing down or braking the vehicle. When a driver presses down a brake pedal, a mode may be changed from the first drive mode 30 to the regeneration mode to reclaim regenerative braking energy from the motor. When the vehicle is in the regeneration mode 50, if the driver presses down an accelerator pedal for normal driving, a mode may be changed to the first drive mode 30.

The power assist mode 60 using both power of the fuel cell and power of the high-voltage battery is a drive mode in which the degree of pressing the accelerator pedal by a driver is more than a predetermined depth or power of the fuel cell reaches a predetermined level. When driving in the first drive mode 30, if the degree of pressing an accelerator pedal by the driver is more than a predetermined depth or the power of the fuel cell reaches a predetermined level, the mode may be changed to a power assist mode 60, and vice versa.

The fuel cell stop mode 70 indicates that an operation of the fuel cell is stopped and a vehicle is driven only using the high-voltage battery in a low power region or low speed region. When driving in the low power region, voltage of the fuel cell may be increased, and this may be a detrimental effect to durability of the fuel cell. Accordingly, the operation of the fuel cell stops in the low power region. Generally, when slowing down the vehicle to brake, the mode is changed from the first drive mode 30 to the regeneration mode 50, and when the vehicle stops, the mode is changed to the fuel cell stop mode 70. Then, when a speed of the vehicle or a demanded power of vehicle is more than a predetermined level, the fuel cell is re-operated, and the mode is changed to the first drive mode 30.

The urgent mode 80 indicates an emergency mode wherein the vehicle is driven only using a high-voltage battery when the fuel cell system breaks down. Generally, in case of the urgent mode 80, the fuel cell is not re-operated until turning off the ignition. However, in the case of the urgent mode 80 resulting from a hydrogen leak or fuel cell breakdown, the mode is changed to the first drive mode 30 by trying reoperation of the fuel cell. However, if the reoperation fails, the urgent mode 80 is maintained until the key is turned off.

As shown in FIG. 5, a charging voltage for a low-voltage battery is set based on a SOC of the low-voltage battery, a vehicle operation mode, and a SOC of a high-voltage battery. If the operation mode of the vehicle is the first drive mode 30, the charging voltage for the low-voltage battery is set to the sum of the base charging voltage and an offset charging voltage, and the offset charging voltage is set based on a SOC of the high voltage battery. If the operation mode of the vehicle is the fuel cell stop mode 70, the charging voltage for the low-voltage battery may be set to the base charging voltage.

For example, a controller 110 of the apparatus for controlling low-voltage battery charging according to an embodiment of the present inventive concept charges the low-voltage battery based on the multiple stages classified by the SOC of the high-voltage battery when the vehicle is in the first drive mode 30. In other words, the controller 110 charges the low-voltage battery adapted to a fourth charging voltage, fifth charging voltage, sixth charging voltage, or seventh charging voltage when the current SOC is the critical high stage, normal stage, low stage, or critical low stage, respectively. The fourth charging voltage may be lower than fifth, sixth, and seventh charging voltage. The fifth charging voltage is higher than the fourth charging voltage and lower than the sixth and seventh charging voltage. The sixth charging voltage may be higher than the fourth and fifth charging voltage and lower than the seventh charging voltage. The seventh charging voltage may be higher than the fourth, fifth, and sixth charging voltage. In other words, the fourth, fifth, sixth, and seventh charging voltage is determined by adding the offset charging voltage to the base charging voltage respectively, and the offset charging voltage is set high as the SOC of the high-voltage battery is low.

The controller 110 of the apparatus for controlling low-voltage battery charging according to an embodiment of the present inventive concept sets charging voltage of the low-voltage battery to an eighth charging voltage when the mode is the regeneration mode 50 of the second drive mode 40, and sets it to a ninth charging voltage when the mode is the power assist mode 60 of the second drive mode 40. The controller 110 sets the charging voltage of the low-voltage battery to the base charging voltage when the vehicle is in the fuel cell stop mode 70, and sets it to a tenth charging voltage when the vehicle is in the urgent mode 80. The eighth charging voltage may be higher than the third charging voltage of the base charging voltage. The ninth and tenth charging voltage may be higher than first charging voltage of the base charging voltage and lower than the third charging voltage.

In other words, fuel efficiency of the fuel cell and hybrid vehicle may be improved by differently setting charging voltage for a low-voltage battery depending on base charging voltage, a vehicle operation mode, and a state-of-charge of a high-voltage battery.

However, the values for setting charging voltage and values indicating a degree of the SOC of the high-voltage battery are just an embodiment, and the values may be variably set according to various embodiments.

According to the method and apparatus for charging a low-voltage battery configured as the above description, discharge of the low-voltage battery is prevented by setting charging voltage of the low-voltage battery based on a SOC of the low-voltage battery, and thus, startability of a vehicle may be improved.

The fuel efficiency may be improved by variably controlling voltage charging of the battery according to a state of the battery and vehicle operation mode.

Although the exemplary embodiments of the present inventive concept have been disclosed for illustrative purposes, those skilled in the art will appreciate that various modifications, additions and substitutions are possible, without departing from the scope and spirit of the invention as disclosed in the accompanying claims.

What is claimed is:

1. A method for controlling low-voltage battery charging, comprising steps of:
   determining a state-of-charge (SOC) of a low-voltage battery based on a voltage of the low-voltage battery;
   setting a base charging voltage according to the SOC of the low-voltage battery; and
   setting a charging voltage of the low-voltage battery based on the base charging voltage, a vehicle operation mode, and a SOC of a high-voltage battery,
   wherein the step of determining the SOC comprises:
   a first step for measuring the voltage of the low-voltage battery after a vehicle starts;
   a second step for measuring the voltage of the low-voltage battery after the first step;
   calculating a voltage slope based on the voltage measured in the first step and second step; and
   determining the SOC of the low-voltage battery according to the voltage slope.

2. The method of claim 1, wherein the second step is performed when a driving speed of an electric pump of the vehicle reaches a predetermined speed after the first step.

3. The method of claim 1, wherein the SOC of the low-voltage battery is determined to one among a fully-charged state, a normal state, and a discharged state.

4. The method of claim 3, wherein the SOC of the low-voltage battery is determined to be in the fully-charged state if the voltage slope is greater than a first slope, determined to be in the normal state if the voltage slope is less than the first slope and greater than a second slope, and determined to be in the discharged state if the voltage slope is less than the second slope.

5. The method of claim 3, wherein when the SOC of the low-voltage battery is in the normal state, the base charging voltage is set to be higher than when the SOC is in the fully-charged state, and when the SOC of the low-voltage battery is in the discharged state, the base charging voltage is set to be higher than when the SOC is in the discharged state.

6. The method of claim 1, wherein the vehicle operation mode comprises: drive modes in which a fuel cell is driven; a fuel cell stop mode in which the driving of the fuel cell is stopped and the vehicle is driven only using the high-voltage battery in a low power region or low speed region and an urgent mode in which a system of the fuel cell breaks down, wherein the drive modes include: a first drive mode which has multiple stages; and a second drive mode, and
   wherein the multiple stages are classified based on the SOC of the high-voltage battery so that different charging voltages are applied to each of the multiple stages.

7. The method of claim 6, wherein the second drive mode comprises a regeneration mode and a power assist mode,
   wherein the first driving mode is a mode in which a regenerative braking energy is reclaimed from a motor, and
   wherein the power assist mode is a mode in which both power of the fuel cell and power of the high-voltage battery are used to drive the motor.

8. The method of claim 6, wherein if the vehicle operation mode of the vehicle is the first drive mode, the charging voltage for the low-voltage battery is set to a sum of the base charging voltage and an offset charging voltage, the offset charging voltage being set based on the SOC of the high-voltage battery.

9. The method of claim 6, wherein if the operation mode of the vehicle is the fuel cell stop mode, the charging voltage for the low-voltage battery is set to the base charging voltage.

10. A non-transitory computer-readable recording medium comprising computer executable instructions execution of which causes a controller to perform the method according to claim 1.

11. A apparatus for controlling low-voltage battery charging, comprising:
    a fuel cell stack for supplying a power to a vehicle driving system;
    a high-voltage direct current converter receiving the power from the fuel cell stack;
    a high-voltage battery receiving the voltage which is stepped down by the high-voltage direct current converter;
    a low-voltage direct current converter, which is connected to a high-voltage bus terminal in between the fuel cell stack and the high-voltage direct current converter, for converting the voltage;
    a low-voltage battery charged with the low voltage converted by the low-voltage direct current converter; and
    a controller configured to determine a SOC of a low-voltage battery based on the voltage of the low-voltage battery, to set a base charging voltage according to the SOC of the low-voltage battery, and to set a charging voltage of the low-voltage battery based on the base charging voltage, a vehicle operation mode, and a SOC of the high-voltage battery,
    wherein the controller is configured to determine the SOC by performing:
    a first step for measuring the voltage of the low-voltage battery after a vehicle starts;
    a second step for measuring the voltage of the low-voltage battery after the first step;
    a step of calculating a voltage slope based on the voltage measured in the first step and second step; and
    a step of determining the SOC of the low-voltage battery according to the voltage slope.

* * * * *